United States Patent [19]
Hayama et al.

[11] Patent Number: 6,069,370
[45] Date of Patent: May 30, 2000

[54] FIELD-EFFECT TRANSISTOR AND FABRICATION METHOD THEREOF AND IMAGE DISPLAY APPARATUS

[75] Inventors: Hiroshi Hayama; Shinichi Nishida, both of Tokyo, Japan

[73] Assignee: NEC Corporation, Tokyo, Japan

[21] Appl. No.: 08/824,317

[22] Filed: Mar. 26, 1997

[51] Int. Cl.[7] .................... H01L 29/04; H01L 31/036; H01L 31/0376; H01L 31/20
[52] U.S. Cl. ................... 257/59; 257/57; 257/58
[58] Field of Search .................... 257/59, 57, 58

[56] References Cited

U.S. PATENT DOCUMENTS 5,784,042  7/1998  Ono et al. .
5,847,720  12/1998  Dunand .
5,847,780  12/1998  Kim et al. .

FOREIGN PATENT DOCUMENTS 62-81064  4/1987  Japan .

*Primary Examiner*—Stephen D. Meier
*Attorney, Agent, or Firm*—Helfgott & Karas, P C.

[57] ABSTRACT

An amorphous silicon thin film transistor for active matrix liquid crystal displays according to the present invention comprises a transparent conductive film, which is formed together with a picture element electrode, a metal film, which is formed together with a signal wiring, a multi-layer film, and an insulation substrate. The multi-layer film, which consists of a semi-conductor film, a gate insulation film and a gate metal film, is placed on the transparent conductive film and metal film overlapping respectively at both edges of the multi-layer film.

20 Claims, 17 Drawing Sheets

FIELD-EFFECT TRANSISTOR AND FABRICATION METHOD THEREOF AND IMAGE DISPLAY APPARATUS

BACKGROUND OF THE INVENTION

The present invention relates to a field-effect transistor and fabrication method thereof and an image display apparatus using them. More particularly, the present invention deals with an amorphous silicon thin film transistor (TFT) for active matrix liquid crystal displays.

Active matrix liquid crystal displays (AMLCD) have the following features, namely, thin shape, light weight, low power consumption and high quality display, and have been produced in large quantities recently.

AMLCD usually use amorphous silicon thin film transistors as switching devices.

A staggered-type structure, which consists of source/drain electrodes, a gate electrode, a channel active layer with transistor behavior, and so on, is used popularly for amorphous silicon thin film transistors.

There are two types of amorphous silicon thin film transistors of staggered structure. One is an inverted staggered-type, in which the gate electrode and the glass substrate are located on the same side with respect to the channel active layer. The other type is a staggered type, in which the gate electrode and the glass substrate are located on opposite sides with respect to the channel active layer.

Regarding the amorphous silicon thin film transistor of the staggered type, the thin film transistor structure is constructed such that the source/drain electrodes are made from transparent electrode material. Moreover, the thin film transistor is fabricated using discharging impurity gas so that source/drain areas can be formed. An amorphous silicon layer including impurity is not used in the fabrication process. Details are found in Japanese Unexamined Patent Publication(Kokai) No. Sho-62-81064.

The basic structure of the amorphous silicon thin film transistor described in the above stated Publication, is shown in FIG. 1.

Referring to FIG. 1, the amorphous silicon thin film transistor described above consists of an insulation substrate 1, a pair of source and drain electrodes made of transparent conductive film 2, a semiconductor film 4, a gate insulation film 5, and a gate metal film 6.

Transparent electrode material such as ITO(indium-tin-oxide) generally has high resistivity compared to metallic material such as aluminum or chrome.

However, the long signal wirings laid vertically, and the long gate wirings laid horizontally, on the active matrix liquid crystal display need to have low resistance.

Therefore, thin film transistor such as that shown in FIG. 1 that utilizes transparent electrode material such as ITO for the signal wiring has the problem that signal wiring resistance is high and cannot be reduced.

A solution to this problem would be to add a metal film 3 to the source/drain transparent electrode of the thin film transistor shown in FIG. 1. Adding the metal film 3 as a signal line as shown in FIG. 2 reduces resistance and the structure shown in FIG. 2 is already being used in practice.

In the case of the thin film transistor structure shown in FIG. 2, in which a low resistance signal line made of a metal such as chrome is used for the source/drain electrode, the metal film 3 and the adjacent transparent picture element electrode must be insulated electrically.

Because the transparent picture element electrode and the metal film 3 are formed by two different photoresist processes, alignment precision tolerance between the two photoresist processes, etching process precision tolerance, and minimum isolation spacing width are necessary. Therefore, when the thin film transistor and the transparent picture element electrode are placed two-dimensionally in a display equipment using the thin film transistor structure shown in FIG. 2, the spacing width between the metal film 2 and the adjacent transparent picture element electrode must be wider than if the thin film transistor structure of FIG. 1 were used.

As a result, when the display equipment is made of the thin film transistor structure shown in FIG. 1 or in FIG. 2, the transparent picture element area of the thin film transistor structure shown in FIG. 2 must be smaller than that of the thin film transistor structure shown in FIG. 1 of the same size. That is, there would arise the problem that the use of the thin film transistor structure in FIG. 2 would result in a decrease in the aperture efficiency of the liquid crystal display.

Further, regarding TFT-LCD (thin film transistor liquid crystal display), the gate electrode of the thin film transistor is connected to a so-called scan line, the source electrode is connected to, for example, a data line, and the drain electrode is connected to the picture element electrode. It will be noted that, in the case of data writing for instance, a charge signal is transferred from the source electrode to the drain electrode while a discharge signal is transferred in the opposite direction. Since we could not exactly define which electrode is the source electrode and which electrode is the drain electrode of the thin film transistor, we call one of the electrodes a source/drain electrode, and a pair of electrodes, source/drain electrodes.

SUMMARY OF THE INVENTION

The objectives of the present invention are to solve the aforementioned problems and to provide a field-effect transistor (thin film transistor) that could realize a liquid crystal display equipment with high aperture efficiency and low resistance signal wirings.

Further, another objective of the present invention is to provide a field-effect transistor (thin film transistor) that has enhanced ohmic characteristics.

Further, another objective of the present invention is to provide a field-effect transistor (thin film transistor) that has low leakage current between the source and drain when the gate of the transistor is negatively biased.

The foregoing objectives are attained by providing a field-effect transistor comprising a first, a second, a third, a fourth and a fifth region, in which a current flow path is generated through the fifth region between the first and second regions when a predetermined voltage is applied to the third region, wherein: the first region is made of transparent conductive material and is connected to the fifth region; the second region is made of opaque conductive material and is connected to the fifth region; the third region is made of conductive material and is deposited on the fourth region; the fourth region is made of insulation material and is deposited on the fifth region; and the fifth region is made of semiconductor material. This field-effect transistor according to the present invention will be described in the section on the detail description of the preferred embodiments with reference to FIG. 3.

Further, the foregoing objectives are attained by providing a field-effect transistor comprising a first, a second and a third metal electrode, a semiconductor region, and an insulation region sandwiched between the third metal electrode and the semiconductor region, in which a current flow path is generated through the semiconductor region between the first and second metal electrodes when a predetermined voltage is applied to the third metal electrode, the field-effect transistor being fabricated using a method the steps of which comprise: (a) a forming step of forming a metal film on an insulation substrate; (b) a first patterning step of patterning the metal film into a first metal electrode and a second metal electrode; (c) a discharging step of discharging an impurity gas over the first and second metal electrodes; (d) a depositing step of depositing an amorphous silicon film, an insulation film and a gate electrode film, in the order, on the first and second electrodes and on the insulation substrate; and (e) a second patterning step of patterning a multi-layer film comprising the amorphous silicon film, the insulation film and the gate electrode film into a gate electrode pattern. This field-effect transistor according to the present invention will be described in the section on the detailed description of the preferred embodiments with reference to FIGS. 5A through 5D.

Further, the foregoing objectives are attained by providing a fabrication method of fabricating a field-effect transistor, comprising: (a) a forming step of forming a metal film on an insulation substrate; (b) a patterning step of patterning the metal film into a source electrode and a drain electrode; (c) a discharging step of discharging an impurity gas over the source and drain electrodes; (d) a depositing step of depositing an amorphous silicon film, an insulation film and a gate electrode film, in the order, on the source and drain electrodes and on the insulation substrate; and (e) a patterning step of patterning a multi-layer film comprising the amorphous silicon film, the insulation film and the gate electrode film into a gate electrode pattern. This fabrication method of the field-effect transistor according to the present invention will be described in the section on the detailed description of the preferred embodiments with reference to FIGS. 5A through 5D.

Further, the foregoing objectives are attained by providing a fabrication method of fabricating a field-effect transistor, comprising: (a) a first forming step of forming a metal film on an insulation substrate; (b) a first patterning step of patterning the metal film into a first electrode; (c) a second forming step of forming a transparent conductive film on the insulation substrate; (d) a second patterning step of patterning the transparent conductive film into a second electrode; (e) a discharging step of discharging an impurity gas over the first and second electrodes; (f) a depositing step of depositing an amorphous silicon film, an insulation film and a gate electrode film, in the order, on the first and second electrodes and on the insulation substrate; and (g) a third patterning step of patterning a multi-layer film comprising the amorphous silicon film, the insulation film and the gate electrode film into a gate electrode pattern. This fabrication method of the field-effect transistor according to the present invention will be described in the section on the detailed description of the preferred embodiments with reference to FIGS. 6A through 6D.

Further, the foregoing objectives are attained by providing a fabrication method of fabricating a field-effect transistor, comprising: (a) a first forming step of forming a multi-layer film comprising a transparent electrode film on an insulation substrate, and a metal film on the transparent electrode film; (b) a first patterning step of patterning the multi-layer film into source and drain electrodes; (c) a second forming step of forming a transparent electrode by removing the metal film that is on one of the source and drain electrodes; (d) a discharging step of discharging an impurity gas over the multi-layer film and the transparent electrode; (e) a depositing step of depositing an amorphous silicon film, an insulation film and a gate electrode film, in the order, on the multi-layer film and on the transparent electrode; and (f) a second patterning step of patterning the multi-layer film comprising the amorphous silicon film, the insulation film and the gate electrode film into a gate electrode pattern. This fabrication method of the field-effect transistor according to the present invention will be described in the section on the detailed description of the preferred embodiments with reference to FIGS. 7A through 7E.

Further, the foregoing objectives are attained by providing the aforementioned fabrication method of the field-effect transistor, wherein at the first patterning step, metal parts of the source and drain electrodes are smaller than transparent parts of the source and drain electrodes, respectively, which is attained by over-etching the metal parts. This fabrication method of the field-effect transistor according to the present invention will be described in the section on the detailed description of the preferred embodiments with reference to FIGS. 9A through 9E.

Further, the foregoing objectives are attained by providing a fabrication method of fabricating a field-effect transistor, comprising: (a) a first forming step of forming a transparent electrode film on an insulation substrate; (b) a first patterning step of patterning the transparent film into a transparent source and a transparent drain electrode; (c) a second forming step of forming a multi-layer film by adding a metal film on one of the transparent source and transparent drain electrodes; (d) a discharging step of discharging an impurity gas over the multi-layer film and the transparent electrode film; (e) a depositing step of depositing an amorphous silicon film, an insulation film and a gate electrode film, in the order, on the multi-layer film and the transparent electrode film; (f) a second patterning step of patterning the multi-layer film comprising the amorphous silicon film, the insulation film and the gate electrode film into a gate electrode pattern. This fabrication method of the field-effect transistor according to the present invention will be described in the section on the detailed description of the preferred embodiments with reference to FIGS. 8A through 8E.

Further, the foregoing objectives are attained by providing a fabrication method of fabricating a field-effect transistor, comprising: (a) a first forming step of forming a multi-layer film comprising a metal film on a insulation substrate and forming a transparent electrode film on the metal film; (b) a first patterning step of patterning the multi-layer film into source and drain electrodes; (c) a second forming step of forming a metal electrode by removing the transparent film that is on one of the source and drain electrodes; (d) a discharging step of discharging an impurity gas over the multi-layer film and the metal electrode; (e) a depositing step of depositing an amorphous silicon film, an insulation film and a gate electrode film, in the order; (f) a second patterning step of patterning the multi-layer film comprising the amorphous silicon film, the insulation film and the gate electrode film into a gate electrode pattern. This fabrication method of the field-effect transistor according to the present invention will be described in the section on the detailed description of the preferred embodiments with reference to FIGS. 10A through 10E.

Further, the foregoing objectives are attained by providing an image display apparatus, comprising: a plurality of field-effect transistors according to one of claims 1 through 18, the gate electrode of each transistor being connected to one of the gate lines and the source or drain electrodes of each transistor being connected to one of the data lines; a transparent substrate on which the plurality of field-effect transistors, the gate lines and the data lines are placed; liquid crystal, each part of which corresponds each of the plurality of field-effect transistors. This image display apparatus according to the present invention will be described in the section on the detailed description of the preferred embodiments with reference to FIGS. 11 and 13.

Further, the foregoing objectives are attained by providing a field effective typed insulation gate thin film transistor, comprising: a source electrode and a drain electrode, which are isolated from each other; wherein, one of the electrodes is made of transparent electrode material, and the other, of metal material.

Further, the foregoing objectives are attained by providing a field effective insulated gate thin film transistor, comprising: a source electrode and a drain electrode, which are isolated from each other; wherein, one of the electrodes is made of transparent electrode material, and the other, comprising a multi-layer structure of metal material and transparent material.

Other features and advantages of the present invention will be apparent from the following description taken in conjunction with the accompanying drawings, like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will be described in detail with reference to the accompanying drawings.

Figure 3:
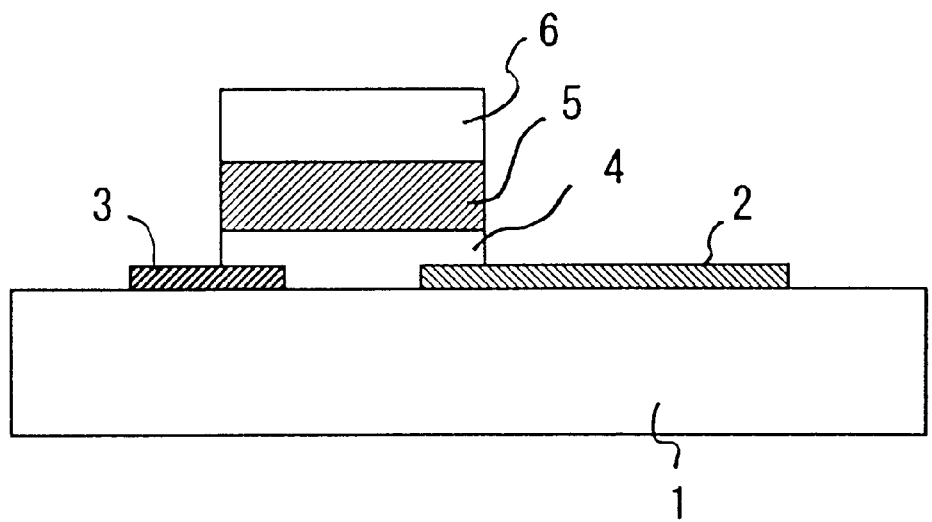
FIG. 3 shows a cross-sectional view of the first embodiment according to the present invention.

The principle and behavior of the present invention will be described. FIG. 3 shows the cross section model diagram of the thin film transistor according to the present invention.

Referring to FIG. 3, the source/drain transparent conductive film 2 formed together with the picture element electrode, and the source/drain metal film 3 formed together with the signal wiring are placed on the insulation substrate 1. The multi-layer film which consists of the semi-conductor film 4, the gate insulation film 5 and the gate metal film 6 is placed on the transparent conductive film 2 and the metal film 3 overlapping respectively at both edges of the multi-layer film.

The action of the thin film transistor of the invention shown FIG. 3 will be described and compared to FIG. 1 and FIG. 2, which show the prior-art thin film transistor structures.

Figure 1:
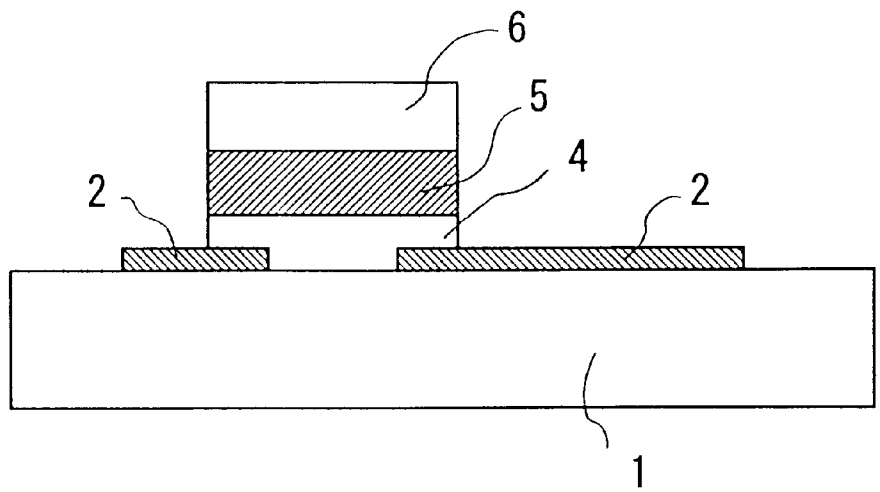
FIG. 1 shows a cross-sectionel view of a prior art thin film transistor.
Figure 2:
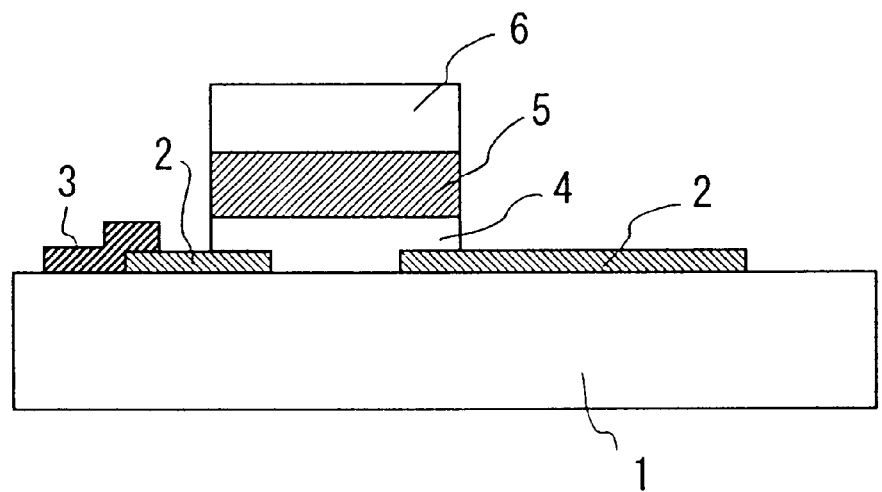
FIG. 2 shows a cross-sectional view of another prior art thin film transistor.

The thin film transistors shown in FIG. 1 and in FIG. 2 are based on a thin film transistor structure in which the source/drain electrodes are formed using transparent electrode material, and on a thin film transistor fabrication method in which source/drain areas are formed by discharging ITO, a transparent electrode material, in an impurity gas environment. Said structure and method are described in the Japanese Unexamined Patent Publication (Kokai)No. Sho-62-81064.

The inventors of the present invention have discovered in an experiment that it is possible to enhance the ohmic characteristics of a thin film transistor by discharging impurity gas (i.e., a mixture of Argon gas and Phosphin) over the source/drain electrodes of the thin film transistor. The principle of the thin film transistor fabrication method according to the present invention is based on the experimental results.

Consequently the inventors have discovered that the metal material, excluding ITO(the transparent conductive film 2 in FIG. 1 and in FIG. 2), can be used for the source/drain electrodes of the thin film transistor.

That is, the invention is based upon the above knowledge. As shown in the thin film transistor of FIG. 3, the transparent conductive film 2 can be used for the source/drain electrode of the picture element side, for which transparency is required, and the metal film 3 can be used for the source/drain electrode of the signal wiring side, which is required to have low resistivity.

Figure 4:
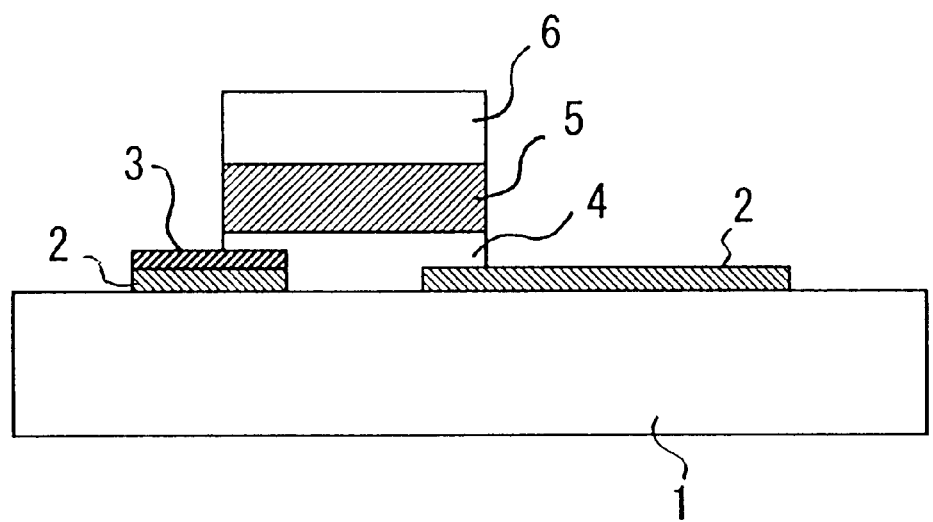
FIG. 4 shows a cross-sectional view of the second embodiment.

FIG. 4 shows another model structure of the thin film transistor of the present invention in order to explain the principle and behavior of the present invention.

Referring to the thin film transistor structure in FIG. 4, as a result of the invention that uses the metal material for the source/drain electrodes, it is possible to use the transparent conductive film 2 for the source/drain electrode of the picture element side, where transparency is required, and to use a multi therefore-layer(two-layer) structure of transparent conductive film 2 and metal film 3 for the source/drain electrode of the signal wiring side, where low resistivity is required.

Figure 7A:
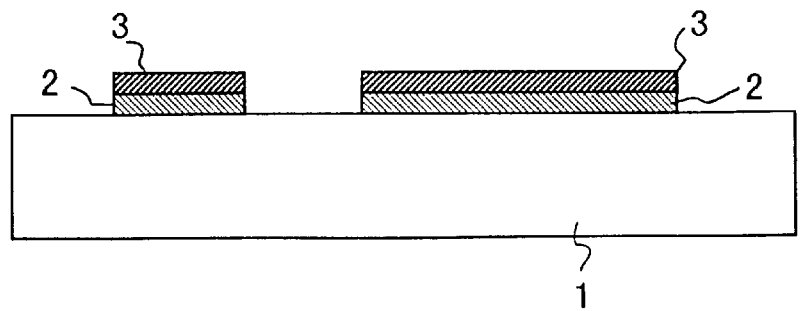
FIG. 7A, FIG. 7B, FIG. 7C, FIG. 7D, and FIG. 7E show cross-sectional views of the fabrication process order showing the fifth embodiment of the thin film transistor fabrication method of the present invention.
Figure 7B:
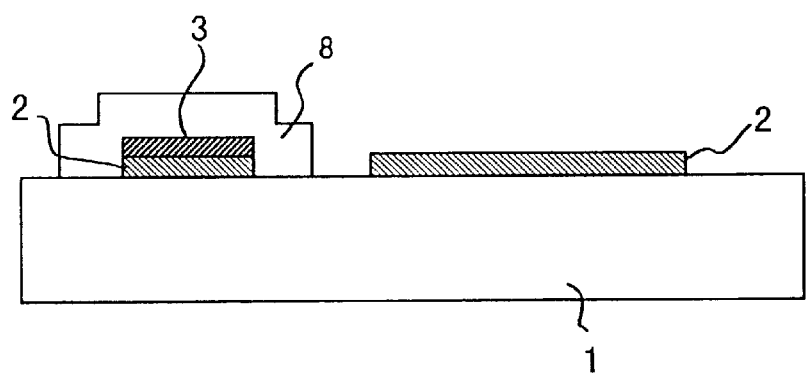
Figure 7C:
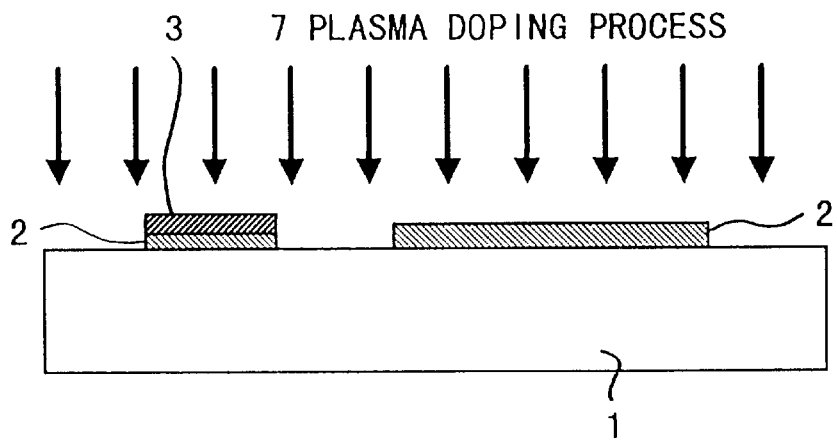
Figure 7D:
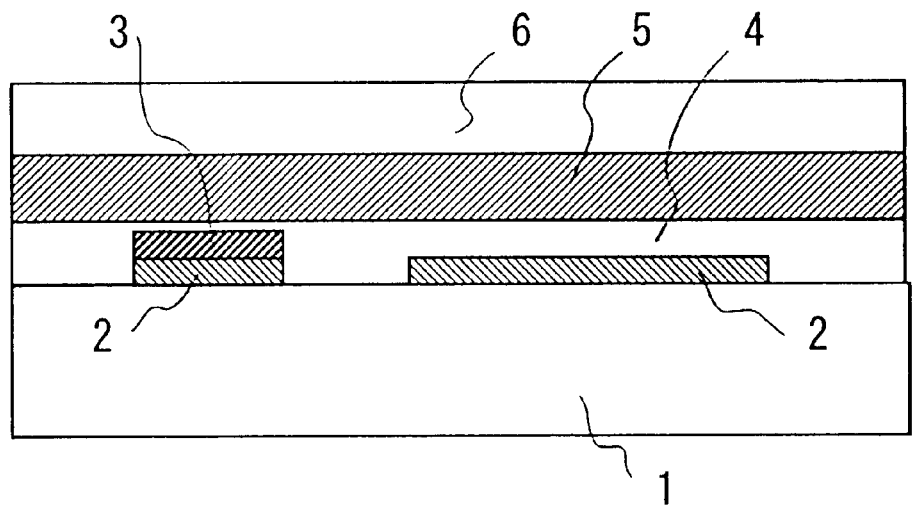
Figure 7E:
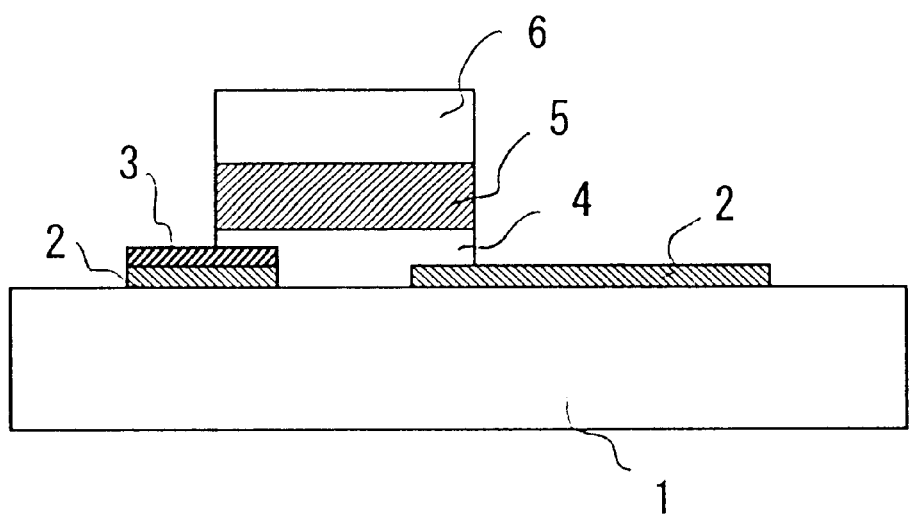

In addition, in accordance with the present invention, a desirable fabrication method for the thin film transistor is realized, in which the source/drain area of the signal wiring side requiring low resistivity comprises the low resistant multi-layer(two-layer) film, which consists of the metal film 3 on top of the transparent conductive film 2 (FIG. 7E).

Figure 10A:
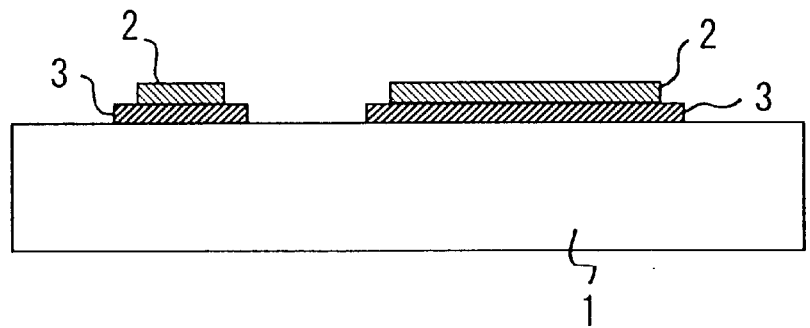
FIG. 10A, FIG. 10B, FIG. 10C, FIG. 10D, and FIG. 10E show cross-sectional views of the fabrication process order showing the eighth embodiment of the thin film transistor fabrication method of the present invention.
Figure 10B:
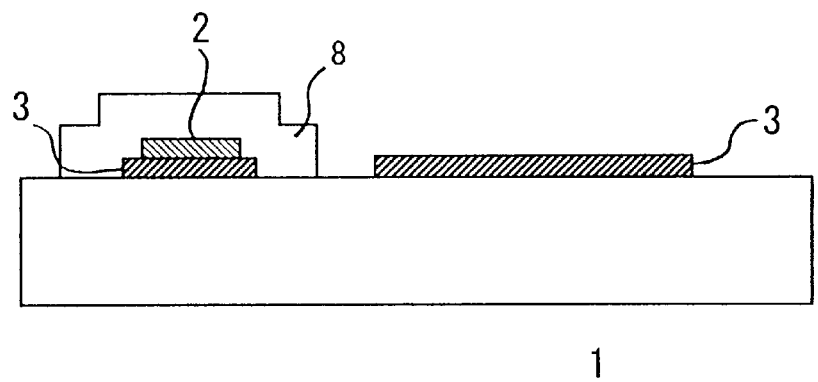
Figure 10C:
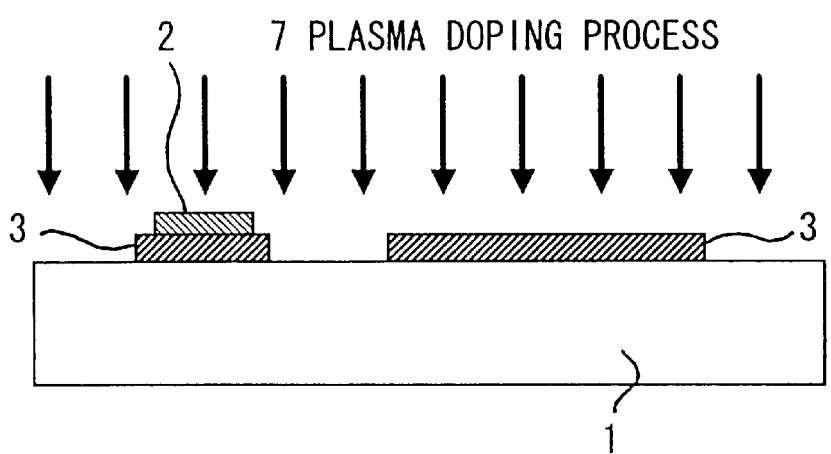
Figure 10D:
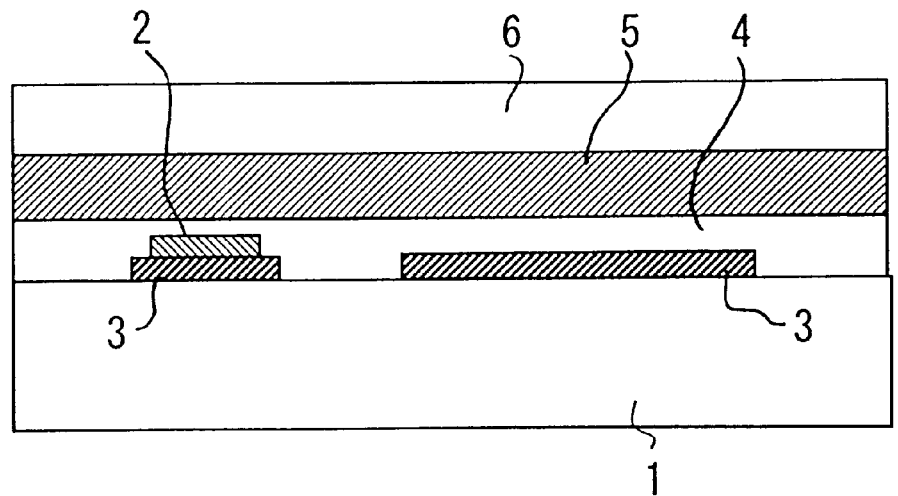
Figure 10E:
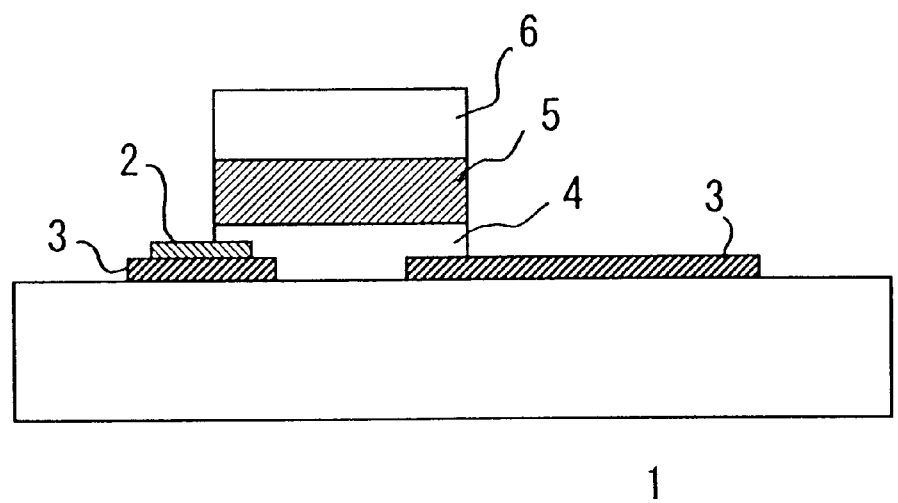

Further, according to the thin film transistor fabrication method in accordance with the present invention, the source/drain area of the signal wiring side requiring low resistivity comprises the low resistance multi-layer(two-layer) film which consists of the metal film 3 on top of the transparent conductive film 2 (FIG. 10E).

First Embodiment

Referring to FIG. 3, the thin film transistor of the first embodiment of the present invention will be described. The insulation substrate 1 of FIG. 3 is fabricated from a glass substrate or a glass substrate with silicon dioxide film or silicon nitride film deposited on its main surface. The transparent conductive film 2 is fabricated by patterning the ITO thin film.

The metal film 3 is fabricated from patterned chrome or aluminum thin film. The multi-layer film which consists of the semiconductor film 4, the gate insulation film 5 and the gate metal film 6 is fabricated by depositing nitride film on hydrogen amorphous silicon film, and then depositing chrome or aluminum thin film on the nitride film.

The thin film transistor shown in FIG. 3 is fabricated by patterning the multi-layer film formed by the above depositing processes.

Second Embodiment

FIG. 4 shows the thin film transistor structure of the second embodiment of the present invention. Referring to FIG. 4, the insulation substrate 1 of FIG. 4 is fabricated from a glass substrate, or a glass substrate with silicon dioxide film or silicon nitride film deposited on its main surface. Then the transparent conductive film 2 is fabricated easily by patterning the ITO thin film. The metal film 3 is fabricated by patterning the chrome or aluminum thin film.

The multi-layer film which consists of the semiconductor film 4, the gate insulation film 5 and the gate metal film 6 is fabricated by depositing silicon nitride film on hydrogen amorphous silicon film, and then depositing chrome or aluminum thin film on the silicon nitride film.

The transistor shown in FIG. 4 is fabricated by patterning the multi-layer film formed by the above depositing processes.

Third Embodiment

FIG. 5A, FIG. 5B, FIG. 5C and FIG. 5D show the process steps of the first embodiment of the thin film transistor fabrication method according to the present invention. The embodiment of the present invention will be described in process order with reference to FIG. 5A, FIG. 5B, FIG. 5C and FIG. 5D.

For instance, OA-2 made by Nippon Electric Glass Corporation, Corning 7059 glass made by Cornig Glass Works, or glass on which silicon dioxide film or silicon nitride film is deposited with thickness ranging from several ten nanometers through several micrometers using the CVD method or the vacuum evaporation method, could be used for the insulation substrate.

Next, chrome or aluminum thin film, several ten nanometers through several hundred nanometers in thickness, is deposited on the substrate by the vacuum evaporation method. Patterning the above film via ordinary photoresist process and etching process results in the metal film 3 shown in FIG. 5A.

Figure 5A:
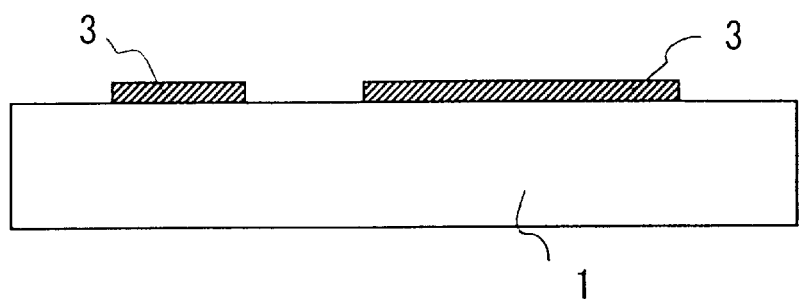
FIG. 5A, FIG. 5B, FIG. 5C and FIG. 5D show cross-sectional views of the fabrication process order showing the third embodiment of the thin film transistor fabrication method of the present invention.
Figure 5B:
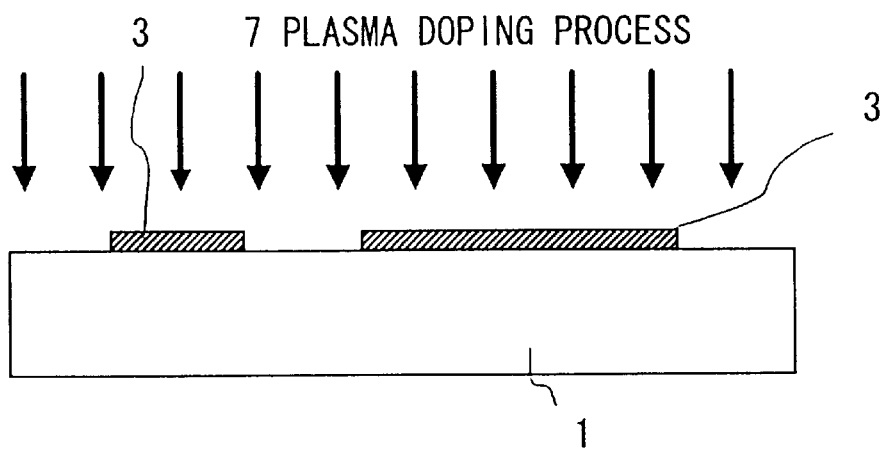

Next step is discharging an impurity gas. Argon gas mixed with 0.5% Phosphin is used as the impurity gas, and the impurity gas is flowed to a plasma CVD equipment with airflow between several hundred sccm and several thousand sccm (for example 1000 sccm). Pressure is between several ten pa and several hundred pa (for example 100 pa). Discharging electric power is several ten $mW/cm^2$ (for example 20 $mW/cm^2$). Temperature between 150 degrees and 350 degrees centigrade is desirable (250 degrees centigrade is used). This situation is shown in FIG. 5B The purpose of discharging the impurity gas over the metal electrode 3 is to deposit a thin impurity material (i.e., Phosphor) on the metal film 3. As a result, when the next process of depositing hydrogen amorphous silicon film is performed, the atoms of the thin impurity material are doped into the hydrogen amorphous silicon film, and thus $n^+$ regions (i.e., source and drain regions) are formed. Since the $n^+$ regions are formed between the hydrogen amorphous silicon film and the metal electrode 3, the contact between the hydrogen amorphous silicon film and the metal electrode 3 can have an ideal ohmic characteristic. Moreover, since the $n^+$ regions work well as blocking layers against hole current, the leakage current between the source and drain due to the hole current when the gate of the transistor according to the present invention is biased negatively, can be lowered.

The plasma CVD equipment is used to make the hydrogen amorphous silicon film and the silicon nitride film. The hydrogen amorphous silicon film, which corresponds to the semiconductor film 4, is formed by discharging in a silane-type gas environment. Further, the silicon nitride film, which corresponds to the gate insulation film 5, is formed by discharging in a gas mixture environment of silane, ammonia, hydrogen and so on in the same way ordinary hydrogen amorphous silicon and silicon nitride films are formed.

Figure 5C:
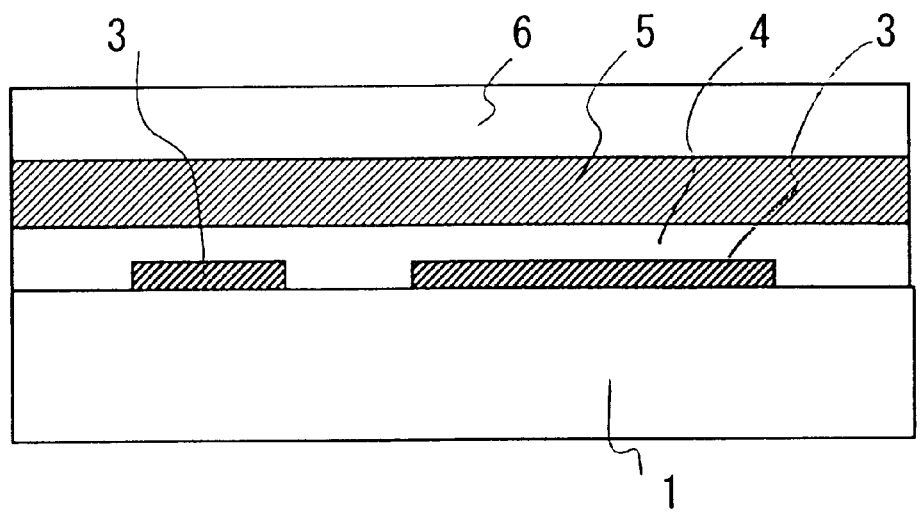
Figure 5D:
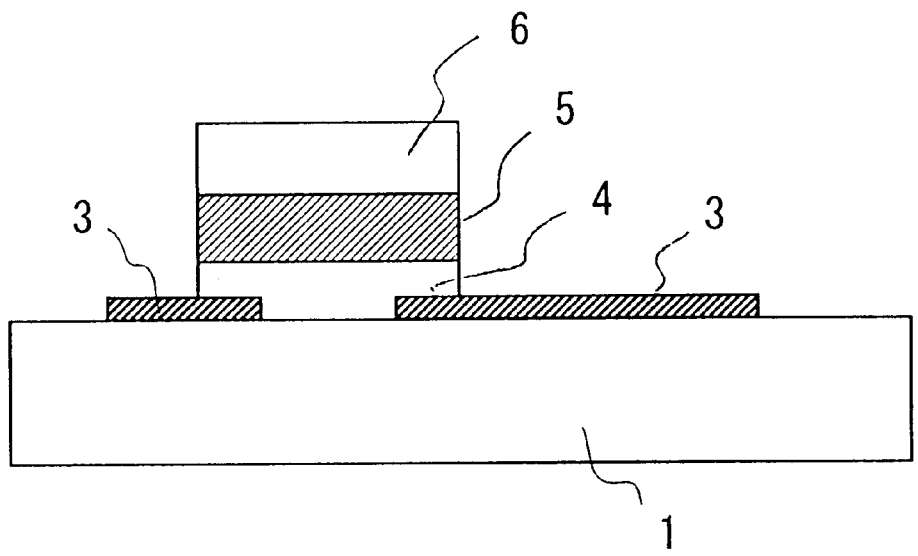

The gate metal film 6 is formed by depositing chrome or aluminum thin film ten nanometers through several hundred nanometers in thickness on the thin film by the vacuum evaporation method. The structure shown in FIG. 5C is formed in this way.

The multi-layer film which consists of the semiconductor film 4, the gate insulation film 5 and the gate metal film 6 are patterned using the ordinary photoresist and etching processes. Since the multi-layer thin film comprising different materials must be etched, the combination of dry etching and wet etching and the exchanging of etching gas during the dry etching process are employed. The thin film transistor shown in FIG. 5D was fabricated in this way.

Fourth Embodiment

FIG. 6A, FIG. 6B, FIG. 6C and FIG. 6D show the process steps of a fourth embodiment of the thin film transistor fabrication method according to the present invention. The embodiment of the present invention will be described in process order with reference to FIG. 6A, FIG. 6B, FIG. 6C and FIG. 6D.

For instance, OA-2 made by Nippon Electric Glass Corporation, 7059 glass made by Kornig Corporation, or glass on which silicon dioxide film or silicon nitride film is deposited with thickness ranging from several ten nanometers through several micro-meters using the CVD method or the vacuum evaporation method, could be used for the insulation substrate.

Next chrome or aluminum thin film several ten nanometers through several hundred nanometers in thickness is deposited on the substrate using the vacuum evaporation method. Patterning the above film via ordinary photoresist process and etching process results in the metal film 3. Further the ITO thin film is deposited several ten nanometers through several nanometers in thickness using the vacuum evaporation method such as a sputtering method. Then the transparent conductive film (electrode) 2 is formed by patterning the ITO film using ordinary photoresist and etching processes. The structure is shown FIG. 6A.

Figure 6A:
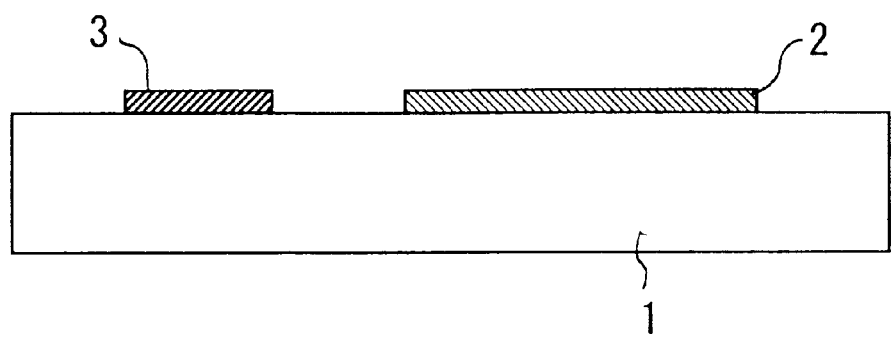
FIG. 6A, FIG. 6B, FIG. 6C and FIG. 6D show cross-sectional views of the fabrication process order showing the fourth embodiment of the thin film transistor fabrication method of the present invention.
Figure 6B:
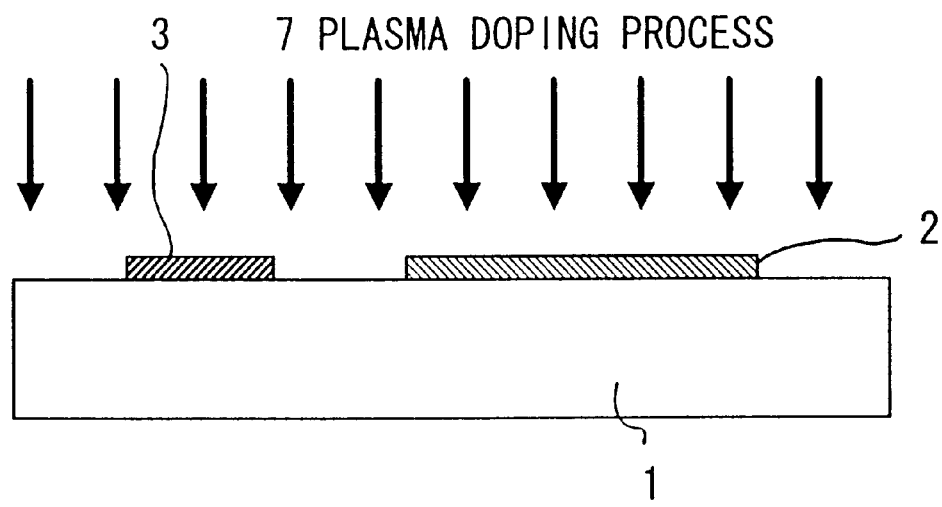

Next step is discharging an impurity gas over the metal electrode 3 and the transparent conductive electrode 2. Argon gas mixed with 0.5% Phosphin is used as the impurity gas, and the impurity gas is flowed to a plasma CVD equipment with airflow between several hundred sccm and several thousand sccm (for example 1000 sccm). Pressure is between several ten pa and several hundred pa (for example 100 pa). Discharging electric power is several ten mW/cm2 (for example 20 mW/cm2). Temperature between 150 degrees and 350 degrees centigrade is desirable (250 degrees centigrade is used). This situation is shown in FIG. 6B.

The purpose of discharging the impurity gas over the metal electrode 3 and the transparent conductive electrode 2 is to deposit a thin impurity material (i.e., Phosphor) on the metal film 3 and the transparent conductive film 2. As a result, when the next process of depositing hydrogen amorphous silicon film is performed, the atoms of the thin impurity material are doped into the hydrogen amorphous silicon film, and thus $n^+$ regions (i.e., source and drain regions) are formed. Since the n+ regions are formed between the hydrogen amorphous silicon film and the metal electrode 3 and also between the hydrogen amorphous silicon film and the transparent conductive electrode 2, the contact between the hydrogen amorphous silicon film and the metal electrode 3, and the contact between the hydrogen amorphous silicon film and the transparent conductive electrode 2 can both have an ideal ohmic characteristic. Moreover, since the $n^+$ regions work well as blocking layers against hole current, the leakage current between the source and drain due to the hole current when the gate of the transistor according to the present invention is negatively biased, can be lowered.

The plasma CVD equipment is used to make the hydrogen amorphous silicon film and the silicon nitride film. The hydrogenized amorphous silicon film, which corresponds to the semiconductor film 4, is formed by discharging in a silane-type gas environment. Further, the silicon nitride film, which corresponds to the gate insulation film 5, is formed by discharging in a gas mixture environment of silane, ammonia, hydrogen and so on in the same way ordinary hydrogen amorphous silicon and silicon nitride films are formed.

Figure 6C:
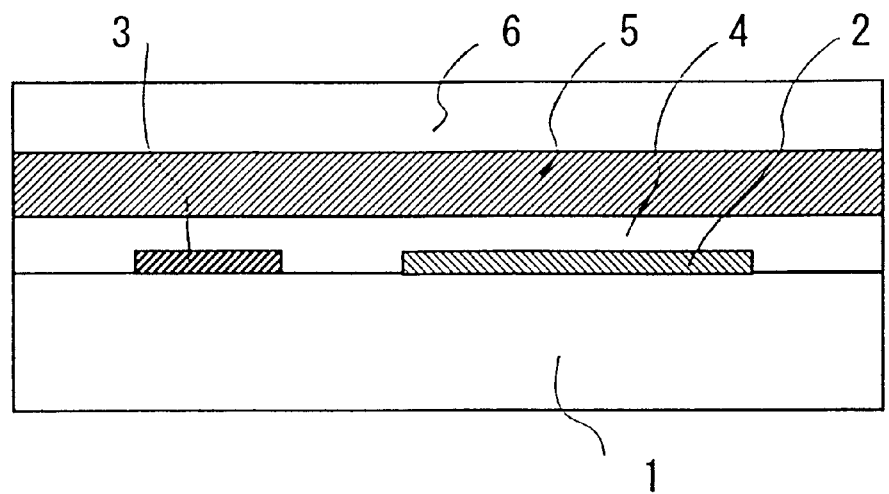

The gate metal film 6 is formed by depositing chrome or aluminum thin film ten nanometers through several hundred nanometers in thickness on the above thin film by the vacuum evaporation method. The structure shown in FIG. 6C is formed in this way.

Figure 6D:
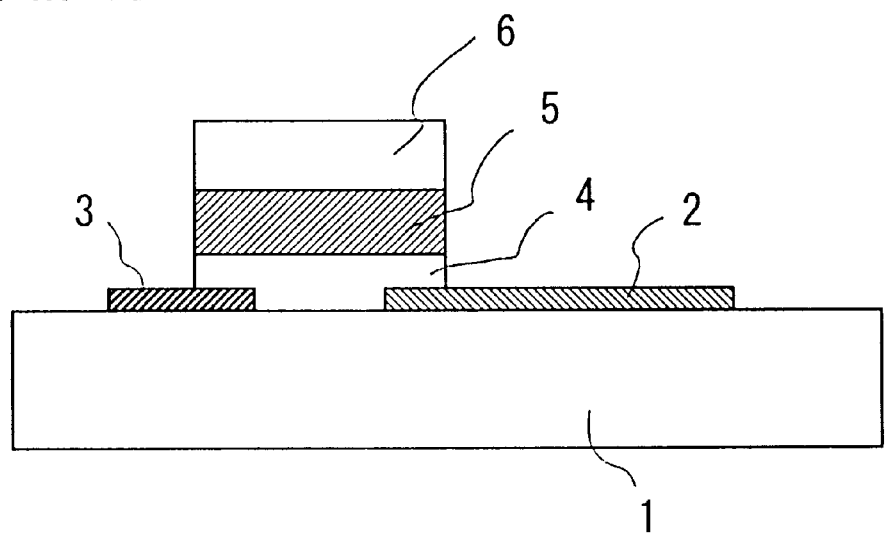

The multi-layer film which consists of the semiconductor film 4, the gate insulation film 5 and the gate metal film 6 are patterned using the ordinary photoresist and etching processes. Since the multi-layer thin film comprising different materials must be etched, the combination of dry etching and wet etching and the exchanging of etching gas during the dry etching process are employed. The thin film transistor shown in FIG. 6D is fabricated in this way.

Fifth Embodiment

FIG. 7A, FIG. 7B, FIG. 7C, FIG. 7D, and FIG. 7E show the process steps of a fifth embodiment of the thin film transistor fabrication method according to the present invention. The embodiment of the present invention will be described in process order with reference to FIG. 7A, FIG. 7B, FIG. 7C, FIG. 7D, and FIG. 7E.

For instance, OA-2 made by Nippon Electric Glass Corporation, 7059 glass made by Kornig Corporation, or glass on which silicon dioxide film or silicon nitride film is deposited with thickness ranging from several ten nanometers through several micro-meters using the CVD method or the vacuum evaporation method, could be used for the insulation substrate.

The ITO thin film and chrome or aluminum thin film, several ten nanometers through several hundred nanometers in thickness, respectively, are deposited in this order using the vacuum evaporation method such as a sputtering method. Patterning the multi-layer film using ordinary photoresist and etching processes results in the structure shown in FIG. 7A. FIG. 7A shows the structure that the transparent conductive film 2 and the metal film 3 are stacked on the insulation substrate and then patterned.

Next, the wanted multi-layer film is covered with the photoresist 8 using the ordinary photoresist process, and the exposed metal film 3 is removed by etching process. In that etching process, it is possible to use a metal wet-etching and a metal dry-etching method in which the insulation substrate 1 and the transparent conductive film 2 are both hard to be etched. Thus, the structure shown in FIG. 7B is attained. FIG. 7B shows that the metal film 3 of the picture element side on the transparent conductive film 2, which is placed on the insulation substrate 1, is removed by etching.

The next step of ordinary photoresist removal and cleaning processes, is discharging an impurity gas over the metal electrode 3 and the transparent conductive electrode 2.

Argon gas mixed with 0.5% Phosphin is used as the impurity gas, and the impurity gas is flowed to a plasma CVD equipment with airflow between several hundred sccm and several thousand sccm (for example 1000 sccm). Pressure is between several ten pa and several hundred pa (for example 10 pa). Discharging electric power is several ten $mW/cm^2$ (for example 20 $mW/cm^2$). Temperature between 150 degrees and 350 degrees centigrade is desirable (250 degrees centigrade is used). This situation is shown in FIG. 7C.

The purpose of discharging the impurity gas over the metal electrode 3 and the transparent conductive electrode 2 is to deposit a thin impurity material (i.e., Phosphor) on the metal film 3 and the transparent conductive electrode 2. As a result, when the next process of depositing hydrogen amorphous silicon film is performed, the atoms of the thin impurity material are doped into the hydrogen amorphous silicon film, and thus $n^+$ regions (i.e., source and drain regions) are formed. Since the $n^+$ regions are formed between the hydrogen amorphous silicon film and the metal electrode 3, and also between the hydrogen amorphous silicon film and the transparent conductive electrode 2, the contact between the hydrogen amorphous silicon film and the metal electrode 3, and the contact between the hydrogen amorphous silicon film and the transparent conductive electrode 2 can both have a ideal ohmic characteristics. Moreover, since the $n^+$ regions work well as blocking layers against hole current, the leakage current between the source and drain due to the hole current when the gate of the transistor according to the present invention is biased negatively, can be lowered.

Further, the plasma CVD equipment is used to make the hydrogen amorphous silicon film and the silicon nitride film. The hydrogen amorphous silicon film, which corresponds to the semiconductor film 4, is formed by discharging in a silane-type gas environment. Further, the silicon nitride film, which corresponds to the gate insulation film 5, is formed by discharging in a gas mixture environment of silane, ammonia, hydrogen and so on in the same way the ordinary hydrogen amorphous silicon and silicon nitride films are formed.

The gate metal film 6 is formed by depositing chrome or aluminum thin film, ten nanometers through several hundred nanometers in thickness, on the above thin film by the vacuum evaporation method. The structure shown in FIG. 7D is formed in this way.

The multi-layer film, which consists of semiconductor film 4, the gate insulation film 5 and the gate metal film 6 are patterned using the ordinary photoresist and etching processes. Since the multi-layer thin film comprising different materials must be etched, the combination of dry etching and wet etching and the exchanging of etching gas during the dry etching process are employed. The thin film transistor shown in FIG. 7E is fabricated in this way.

Sixth Embodiment

FIG. 8A, FIG. 8B, FIG. 8C, FIG. 8D, and FIG. 8E show the process steps of a sixth embodiment of the thin film transistor fabrication method according to the present invention. The embodiment of the present invention will be described in process order with reference to FIG. 8A, FIG. 8B, FIG. 8C, FIG. 8D, and FIG. 8E.

For instance, OA-2 made by Nippon Electric Glass Corporation, Corning 7059 glass made by Cornig Glass Works, or glass on which silicon dioxide film or silicon nitride film is deposited with thickness ranging from several ten nanometers through several micro-meters using the CVD method or the vacuum evaporation method, could be used for the insulation substrate.

Figure 8A:
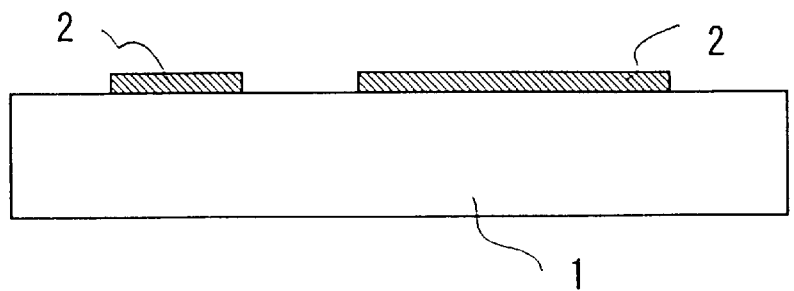
FIG. 8A, FIG. 8B, FIG. 8C, FIG. 8D, and FIG. 8E show cross-sectional views of the fabrication process order showing the sixth embodiment of the thin film transistor fabrication method of the present invention.
Figure 8B:
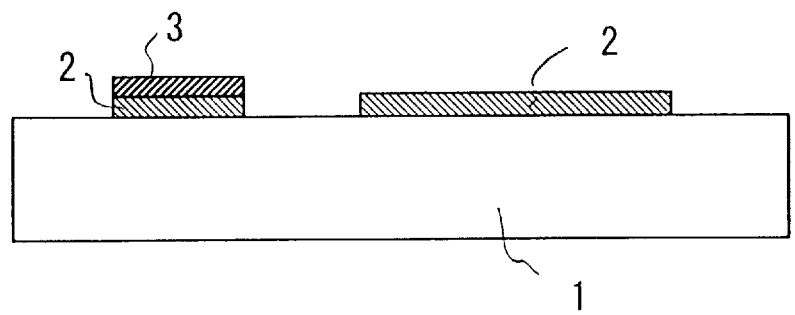

The ITO thin film, several ten nanometers through several nanometers in thickness, is deposited using the vacuum evaporation method such as a sputtering method. The transparent conductive film 2 is formed by patterning the ITO film using ordinary photoresist and etching processes. The structure is shown in FIG. 8A.

Next, the metal film 3 is deposited only on the wanted ITO pattern using a self selective method such as an electric gilding. Thus, the structure shown in FIG. 8B was formed.

Figure 8C:
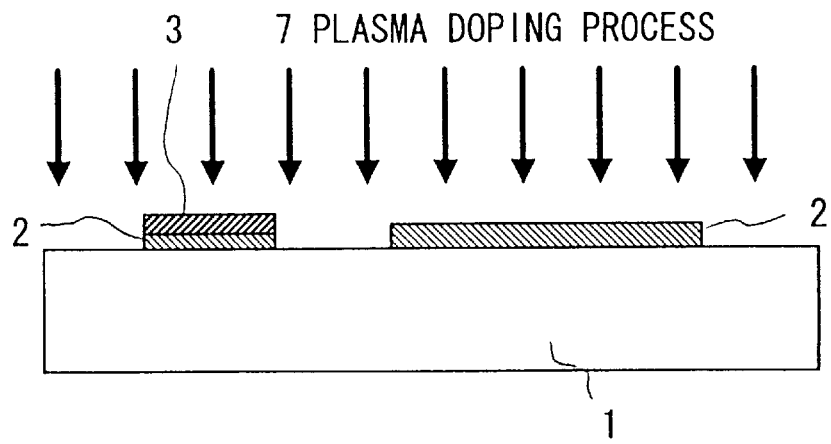

The next step of the cleaning process is discharging an impurity gas over the metal electrode 3 and the transparent conductive electrode 2. Argon gas mixed with 0.5% Phosphin is used as the impurity gas, and the impurity gas is flowed to a plasma CVD equipment with airflow between several hundred sccm and several thousand sccm (for example 1000 sccm). Pressure is between several ten pa and several hundred pa (for example 100 pa). Discharging electric power is several ten $mW/cm^2$ (for example 20 $mW/cm^2$). Temperature between 150 degrees and 350 degrees centigrade is desirable (250 degrees centigrade is used). This situation is shown in FIG. 8C.

The purpose of discharging the impurity gas over the metal electrode 3 and the transparent conductive electrode 2 is to deposit a thin impurity material (i.e., Phosphor) on the metal film 3 and the transparent conductive film 2. As a result, when the next process of depositing hydrogen amorphous silicon film is performed, the atoms of the thin impurity material are doped into the hydrogen amorphous silicon film, and thus $n^+$ regions (i.e., source and drain regions) are formed. Since the $n^+$ regions are formed between the hydrogen amorphous silicon film and the metal electrode 3, and also between the hydrogen amorphous silicon film and the transparent conductive film 2, the contact between the hydrogen amorphous silicon film and the metal electrode 3, and the contact between the hydrogen amorphous silicon film and the transparent conductive film 2 can both have an ideal ohmic characteristics. Moreover, since the $n^+$ regions work well as blocking layers against hole current, the leakage current between the source and drain due to the hole current when the gate of the transistor according to the present invention is biased negatively, can be lowered.

Figure 8D:
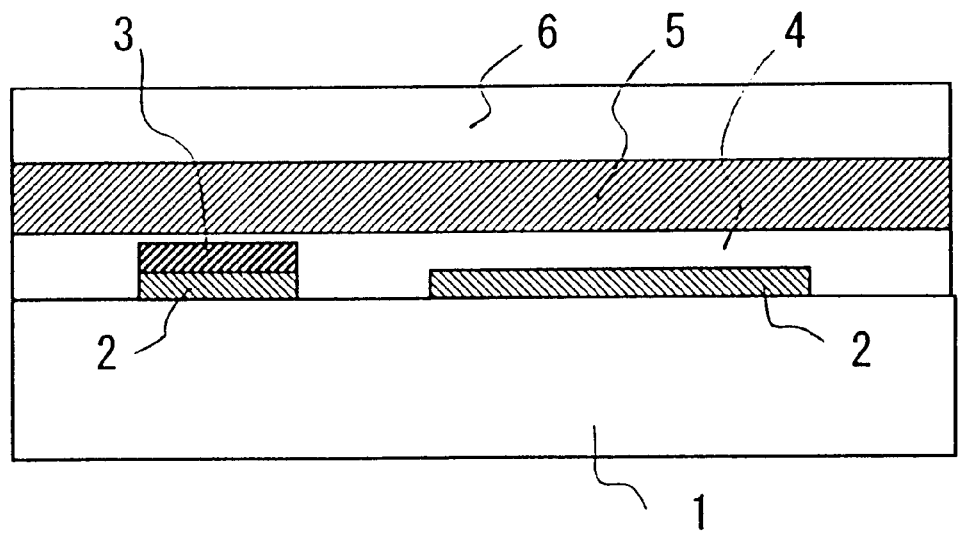

The plasma CVD equipment is used to make the hydrogen amorphous silicon film and the silicon nitride film. The hydrogen amorphous silicon film, which corresponds to the semiconductor film 4, is formed by discharging in a silane-type gas environment. Further, the silicon nitride film, which corresponds to the gate insulation film 5, is formed by discharging in a gas mixture environment of silane, ammonia, hydrogen and so on in the same way the ordinary hydrogen amorphous silicon and silicon nitride films are formed. The gate metal film 6 is formed by depositing chrome or aluminum thin film ten nanometers through several hundred nanometers in thickness on the above thin film by the vacuum evaporation method. The structure shown in FIG. 8D is formed in this way.

Figure 8E:
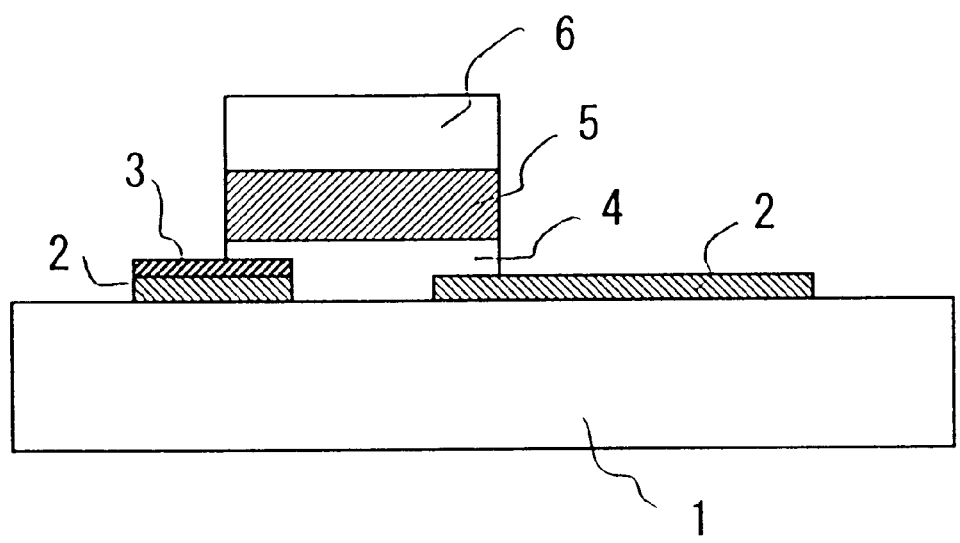

The multi-layer film which consists of the semiconductor film 4, the gate insulation film 5 and the gate metal film 6 are patterned using the ordinary photoresist and etching processes. Since the multi-layer thin film comprising different materials must be etched, the combination of dry etching and wet etching and the exchanging of etching gas during the dry etching process are employed. The thin film transistor shown in FIG. 8E is fabricated in this way.

Seventh Embodiment

FIG. 9A, FIG. 9B, FIG. 9C, FIG. 9D, and FIG. 9E show the process steps of a seventh embodiment according to of the thin film transistor fabrication method in accordance with the present invention. The embodiment of the present invention will be described in process order with reference to FIG. 9A, FIG. 9B, FIG. 9C, FIG. 9D, and FIG. 9E.

For instance, OA-2 made by Nippon Electric Glass Corporation, 7059 glass made by Kornig Corporation, or glass on which silicon dioxide film or silicon nitride film is deposited with thickness ranging from several ten nanometers through several micro-meters using the CVD method or the vacuum evaporation method, could be used for the insulation substrate.

Next, the ITO thin film and chrome or aluminum thin film, several ten nanometers through several hundred nanometers in thickness, respectively, are deposited using the vacuum evaporation method such as a sputtering method. Patterning the multi-layer film using ordinary photoresist and etching processes forms the structure shown in FIG. 9A In the above etching, the metal film 3 pattern is over-etched to be 0.1 micro-meters through several micro-meters smaller than that of transparent conductive film 2. Ohmic characteristics of the thin film transistor is improved by the above fabrication method.

Figure 9A:
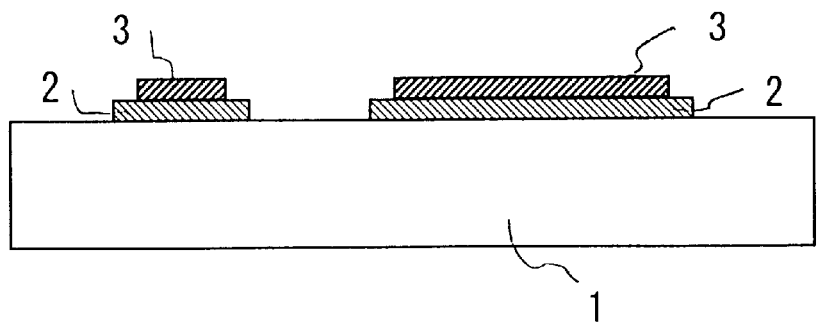
FIG. 9A, FIG. 9B, FIG. 9C, FIG. 9D, and FIG. 9E show cross-sectional views of the fabrication process order showing the seventh embodiment of the thin film transistor fabrication method of the present invention.
Figure 9B:
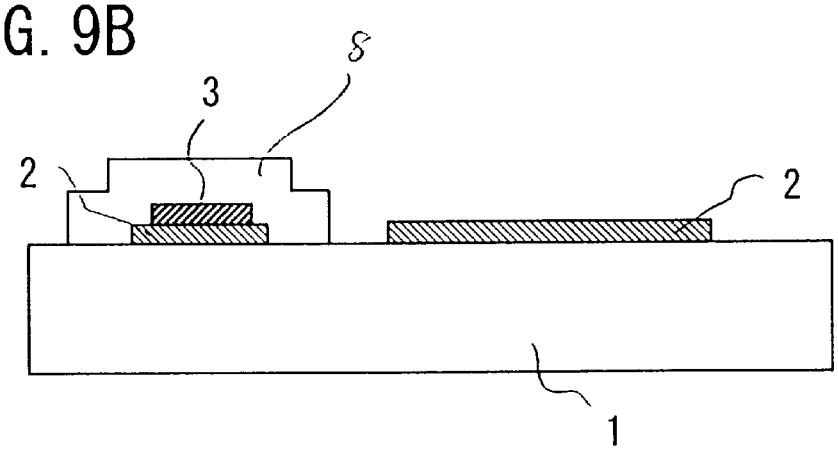

Next, the wanted multi-layer film is covered with the photoresist 8 using ordinary photoresist process and the exposed metal film 3 is removed by etching process. In the above etching process, it is possible to use the metal wet-etching and dry-etching method in which the insulation substrate 1 and the transparent conductive film 2 are hard to be etched. Thus the structure shown in FIG. 9B is attained.

Figure 9C:
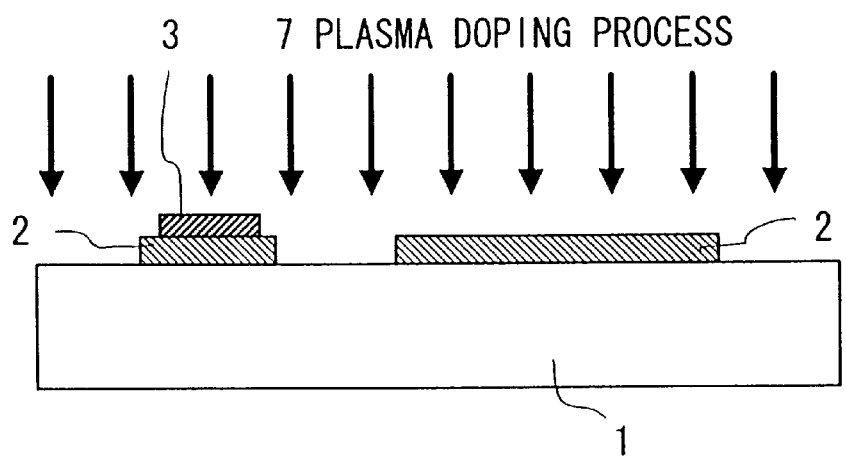

The next step of ordinary photoresist removal and cleaning processes is discharging an impurity gas environment over the metal electrode 3 and the transparent conductive electrode 2. Argon gas mixed with 0.5% Phosphin is used as the impurity gas, and the impurity gas is flowed to a plasma CVD equipment with airflow between several hundred sccm and several thousand sccm (for example 1000 sccm). Pressure is between several ten pa and several hundred pa (for example 100 pa). Discharging electric power is several ten $mW/cm^2$ (for example 20 $mW/cm^2$). Temperature between 150 degrees and 350 degrees centigrade is desirable (250 degrees centigrade is used). This situation is shown in FIG. 9C.

The purpose of discharging the impurity gas over the metal electrode 3 and the transparent conductive electrode 2 is to deposit a thin impurity material (i.e., Phosphor) on the metal film 3 and the transparent conductive film 2. As a result, when the next process of depositing hydrogen amorphous silicon film is performed, the atoms of the thin impurity material are doped into the hydrogen amorphous silicon film, and thus n+ regions (i.e., source and drain regions) are formed. Since the $n^+$ regions are formed between the hydrogen amorphous silicon film and the metal electrode 3, and also between the hydrogen amorphous silicon film and the transparent conductive electrode 2, the contact between the hydrogen amorphous silicon film and the metal electrode 3, and the contact between the hydrogen amorphous silicon film and the transparent conductive electrode 2 can both have an ideal ohmic characteristics. Moreover, since then 3 regions work well as blocking layers against hole current, leakage current between the source and drain due to the hole current when the gate of the transistor according to the present invention is biased negatively, can be lowered.

Further, the plasma CVD equipment is used to make the hydrogen amorphous silicon film and the silicon nitride film. The hydrogen amorphous silicon film, which corresponds to the semiconductor film 4, is formed by discharging in a silane-type gas environment. Further, the silicon nitride film, which corresponds to the gate insulation film 5, is formed by discharging in a gas mixture environment of silane, ammonia, hydrogen and so on in the same way the ordinary hydrogen amorphous silicon and silicon nitride films are formed.

Figure 9D:
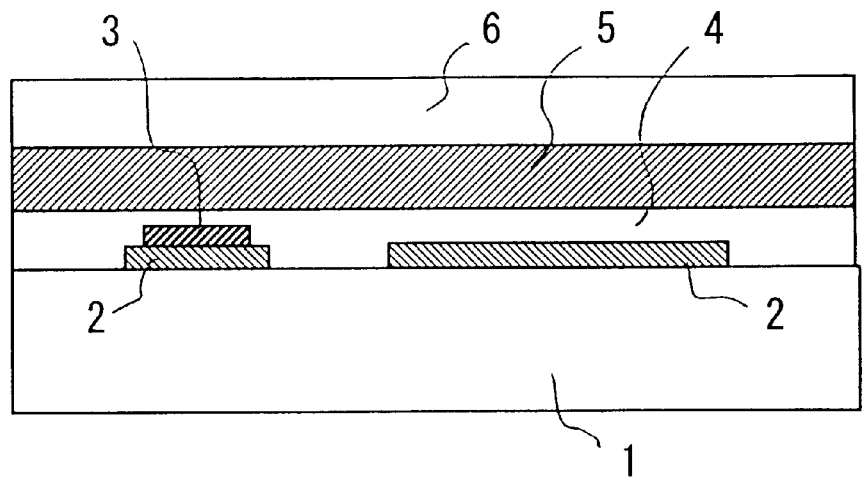

The gate metal film 6 is formed by depositing chrome or aluminum thin film, ten nanometers through several hundred nanometers in thickness, on the above thin film by the vacuum evaporation method. The structure shown in FIG. 9D is formed in this way.

Figure 9E:
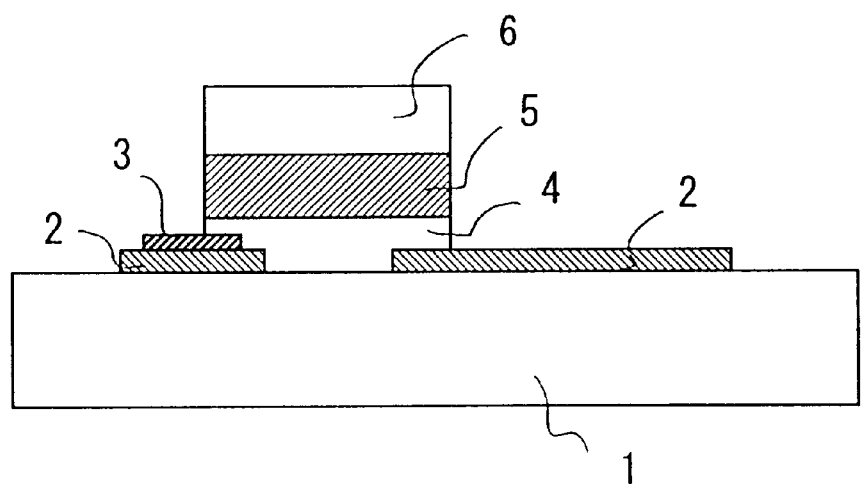

The multi-layer film, which consists of the semiconductor film 4, the gate insulation film 5 and the gate metal film 6, are patterned using the ordinary photoresist and etching processes. Since the multi-layer thin film comprising different materials must be etched, the combination of dry etching and wet etching and the exchanging of etching gas during the dry etching process are employed. The thin film transistor shown in FIG. 9E is fabricated in this way.

Eighth Embodiment

FIG. 10A, FIG. 10B, FIG. 10C, FIG. 10D, and FIG. 10E show the process steps of a eighth embodiment of the thin film transistor fabrication method according to the present invention. The embodiment of the present invention will be described in process order with reference to FIG. 10A, FIG. 10B, FIG. 10C, FIG. 10D, and FIG. 10E.

For instance, OA-2 made by Nippon Electric Glass Corporation, Corning 7059 glass made by Cornig Glass Works, or glass on which silicon dioxide film or silicon nitride film is deposited with thickness ranging from several ten nanometers through several micrometers using the CVD method or the vacuum evaporation method, could be used for the insulation substrate.

Next, chrome and aluminum thin film and the ITO thin film, several ten nanometers through several hundred nanometers in thickness, respectively, are deposited in this order using the vacuum evaporation method such as a sputtering method. Patterning the multi-layer film using ordinary photoresist process and etching process results in the structure shown in FIG. 10A.

FIG. 10A shows that the transparent conductive film 2 is overetched. It is also possible for the transparent conductive film 2 to be etched in the same size as that of the metal film 3.

Next, the wanted multi-layer film is covered with the photoresist 8 using the ordinary photoresist process, and the exposed transparent conductive film 2 is removed by etching process. In the above etching process, it is possible to use the metal wet-etching and dry-etching method in which the insulation substrate 1 and the metal film 3 are hard to be etched. Thus, the structure shown in FIG. 10B is attained.

The next step of ordinary photoresist removal and cleaning processes is discharging an impurity gas over the metal electrode 3 and the transparent conductive electrode 2. Argon gas mixed with 0.5% Phosphin is used as the impurity gas, and the impurity gas is flowed to a plasma CVD equipment with airflow between several hundred sccm and several thousand sccm (for example 1000 sccm). Pressure is between several ten pa and several hundred pa (for example 10 pa ). Discharging electric power is several ten $mW/cm^2$ (for example 20 $mW/cm^2$). Temperature between 150 degrees and 350 degrees centigrade is desirable (250 degrees centigrade is used). This situation is shown in FIG. 10C.

The purpose of discharging the impurity gas over the metal electrode 3 and the transparent conductive electrode 2 is to deposit a thin impurity material (i.e., Phosphor) on the metal film 3 and the transparent conductive film 2. As a result, when the next process of depositing hydrogen amorphous silicon film is performed, the atoms of the thin impurity material are doped into the hydrogen amorphous silicon film, and thus $n^+$ regions (i.e., source and drain regions) are formed. Since the n+ regions are formed between the hydrogen amorphous silicon film and the metal electrode 3, and also between the hydrogen amorphous silicon film and the transparent conductive electrode 2, the contact between the hydrogen amorphous silicon film and the metal electrode 3, and the contact between the hydrogen amorphous silicon film and the transparent conductive electrode 2 can both have an ideal ohmic characteristics. Moreover, since the n+ regions work well as blocking layers against hole current, the leakage current between the source and drain due to the hole current when the gate of the transistor according to the present invention is biased negatively, can be lowered.

Further, the plasma CVD equipment is used to make the hydrogen amorphous silicon film and the silicon nitride film. The hydrogen amorphous silicon film, which corresponds to the semiconductor film 4, is formed by discharging in a silane-type gas environment. Further, the silicon nitride film, which corresponds to the gate insulation film 5, is formed by discharging in a gas mixture environment of silane, ammonia, hydrogen and so on in the same way the ordinary hydrogen amorphous silicon and silicon nitride films are formed.

The gate metal film 6 is formed by depositing chrome or aluminum thin film, ten nanometers through several hundred nanometers in thickness, on the above thin film by the vacuum evaporation method. The structure shown in FIG. 10D is formed in this way.

The multi-layer film which consists of semiconductor film 4, gate insulation film 5 and gate metal film 6 are patterned using the ordinary photoresist and etching processes. Since the multi-layer thin film comprising different materials must be etched, the combination of dry etching and wet etching and the exchanging of etching gas during the dry etching process are employed. The thin film transistor shown in FIG. 10E is fabricated in this way.

Although the above embodiments describe only the fabrication process of the forward staggered-type thin film transistor, it is evident that the present invention could be applicable to the backward staggered-type thin film transistor.

It is clear that a shielding layer pattern, a passivation film, contact holes and so on are to be added to the thin film transistor structure when the transistor of the present invention is applied to actual liquid crystal displays.

It is likewise clear that the fabrication processes of the shielding layer pattern, the passivation film, contact holes and so on are added to before and after the above fabrication process of the thin film transistor structure when the fabrication method of the present invention is applied to actual liquid crystal displays.

Ninth Embodiment

All of the thin film transistors based on the structures or the fabrication method described in the first through eighth embodiments according to the present invention are applicable to actual TFT-LCD display devices. Some application examples will now be described.

Figure 11:
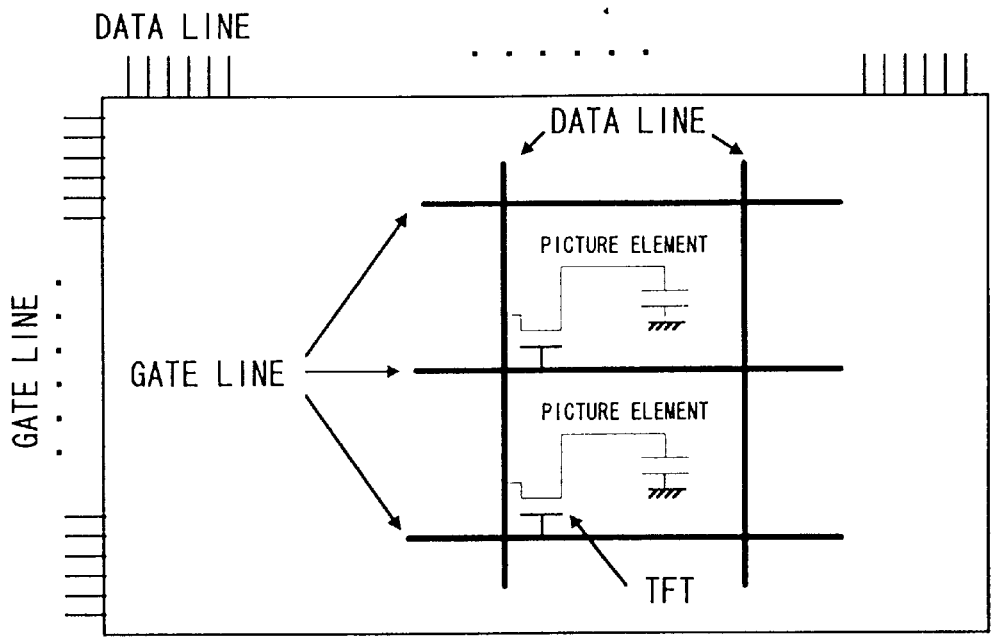
FIG. 11 shows the structure of a TFT-LCD display panel.

FIG. 11 shows the structure of a part of a TFT-LCD display panel. In FIG. 11, for example, pairs of picture elements and thin film transistors are placed like a matrix on the TFT-LCD display panel. A picture element is electrically equivalent to a capacitance. Vertical lines are data lines that provide data signals to the TFT-LCD panel, and horizontal lines are gate lines that provide timing pulses of input data signals. When one of the gate lines is active, data signals of the corresponding row of picture element—thin film transistor pairs are transferred to the picture elements through thin film transistors and stored in the capacitance of picture elements.

Figure 12:
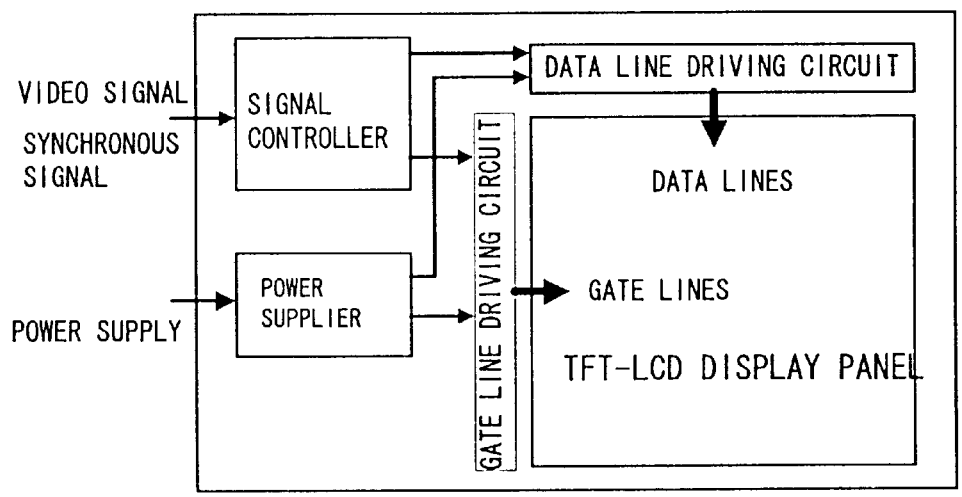
FIG. 12 shows the circuit diagram of a TFT-LCD unit system.

FIG. 12 shows the circuit diagram of a TFT-LCD unit system. Video signal, synchronous signal and power supply are provided externally. THE TFT-LCD display panel has the same structure shown in FIG. 11. A signal controller transfers signal data of one horizontal row to the data line driving circuit and timing pulse to the gate line driving circuit. Then the data line driving circuit provides one row of data signals to the data lines of the TFT-LCD display panel, and the gate line driving circuit provides input timing pulse to the gate lines of TFT-LCD display panel.

Figure 13:
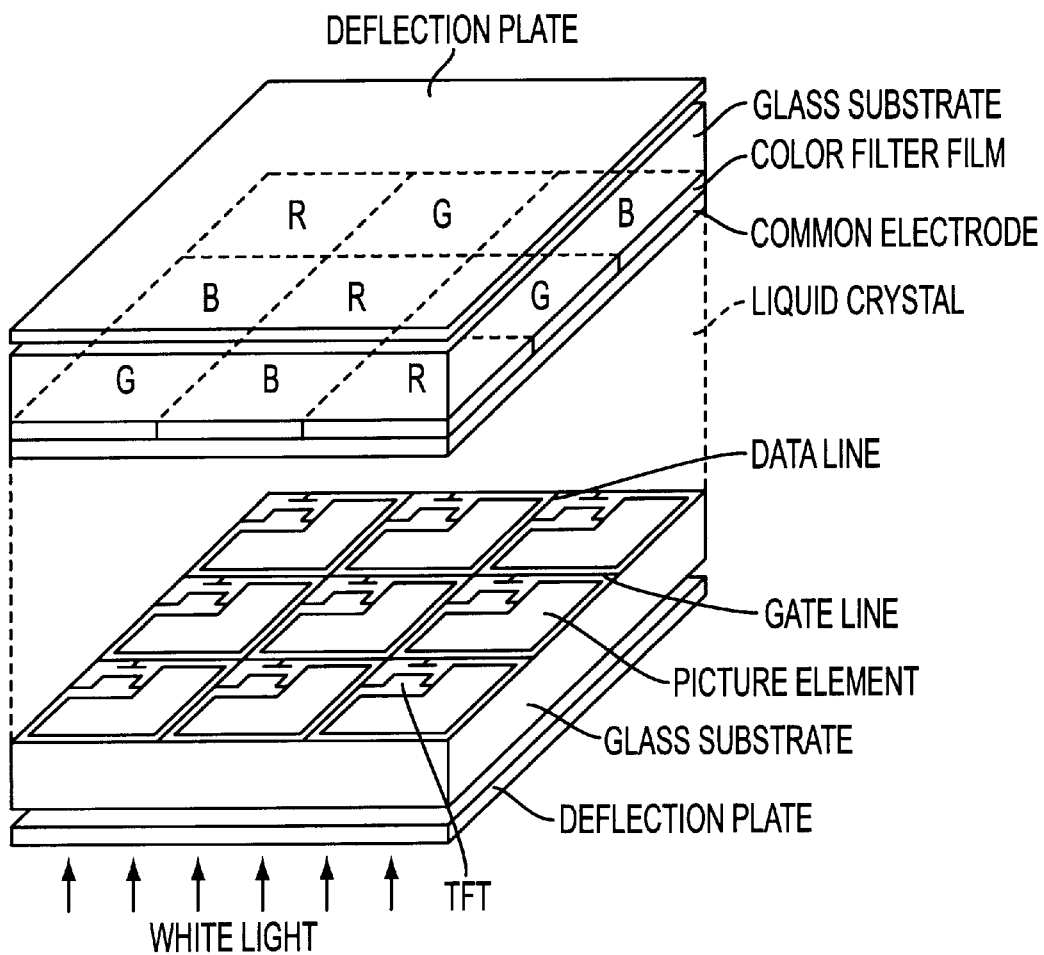
FIG. 13 shows a perspective view of a color transparent TFT-LCD display.

FIG. 13 shows the part structure of a color transparent TFT-LCD display. A color transparent TFT-LCD display has a color filter film which consists of green (G), red (R) and blue (B) films. An example layout of the color filters is illustrated in FIG. 13, which shows, for example, nine square filter elements and their corresponding pairs of thin film transistors and picture elements. The picture elements correspond to the transparent conductive film (electrode) 2 in FIG. 3, FIG. 4, FIG. 6D, FIG. 7E, FIG. 8E, FIG. 9E and FIG. 10E. The white light outputted from a light source (not shown) goes through the glass substrate and the picture element. When a TFT enters an active state, light is allowed to pass through the part of the liquid crystal that corresponds to this TFT. In this manner, an observer can see a color picture through the top deflection plate.

Figure 14:
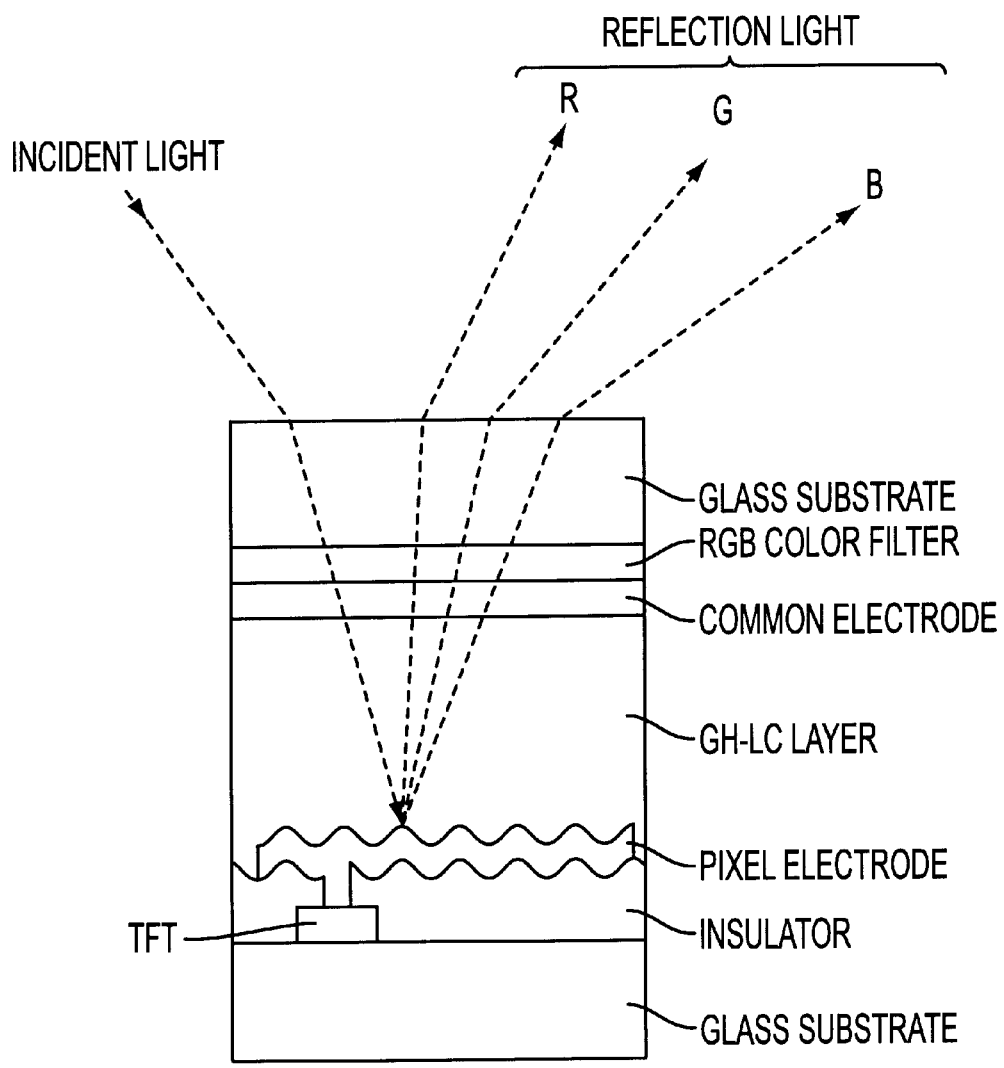
FIG. 14 shows cross-sectional view of a reflective TFT-LCD structure.

FIG. 14 shows a color reflective TFT-LCD structure. RGB color filters and GH(Guest-Host) liquid crystal mode are used in the structure. A pixel electrode for light reflection is connected with the source/drain electrode of the TFT (which is the transistor shown in FIG. 5D) through a contact hole. Incident light is reflected by the pixel electrode and an observer can see a color picture through RGB color filters and the top glass substrate.

As described in the seventh embodiment (FIG. 9A–E), since the metal film 3 pattern is over-etched so that it is smaller than that of the transparent conductive film 2, ohmic characteristics of the thin film transistor can be improved.

Further, as described in the embodiments above, by discharging an impurity gas environment over the metal electrode 3 and/or the transparent conductive electrode 2, the contact between the hydrogen amorphous silicon film and the metal electrode 3, and/or the contact between the hydrogen amorphous silicon film and the transparent conductive electrode 2, can have ideal ohmic characteristics. Moreover, leakage current between the source and drain when the gate of the transistor is negatively biased, can be lowered.

Further, the present invention allows the fabrication of TFT-LCD (thin film transistor liquid crystal display) with high aperture efficiency and low resistance signal wirings and is consequently very effective in attaining large scale and low cost TFT-LCDS.

As many apparently widely different embodiments of the present invention can be made without departing from the spirit and scope thereof, it is to be understood that the invention is not limited to the specific embodiments thereof except as defined in the appended claims.

What is claimed is:

1. A field-effect transistor comprising:
   a first, second, third, fourth and fifth regions;
   a current flow path being generated through said fifth region between said first and second regions when a predetermined voltage is applied to said third region;
   said first region being made of transparent conductive material and is physically and electrically connected to said fifth region;
   said second region being made of opaque conductive material and is physically and electrically connected to said fifth region;
   said third region being made of conductive material and is deposited on said fourth region;
   said fourth region being made of insulation material and is deposited on said fifth region; and
   said fifth region being made of semiconductor material.

2. The field-effect transistor according to claim 1, wherein said third region is a gate, said first region is a source, and said second region is a drain.

3. The field-effect transistor according to claim 1, wherein said third region is a gate, said first region is a drain, and said second region is a source.

4. The field-effect transistor according to claim 1, wherein said transparent conductive material is a transparent conductive film.

5. The field-effect transistor according to claim 1, wherein said opaque conductive material is a metal film.

6. The field-effect transistor according to claim 1, wherein the field-effect transistor is built upon an insulation substrate.

7. The field-effect transistor according to claim 1, wherein said transparent conductive material is an ITO (indium-tin-oxide) film.

8. The field-effect transistor according to claim 1, wherein said opaque conductive material is either chrome or aluminum.

9. The field-effect transistor according to claim 6, further comprising a sixth region made of transparent conductive material, said sixth region being connected between said second region and said insulation substrate.

10. The field-effect transistor according to claim 6, wherein said insulation substrate is made of transparent material.

11. The field-effect transistor according to claim 10, wherein said transparent material is made of glass.

12. A field-effect transistor according to claim 1, wherein an n+ region is interposed between second region and said fifth region.

13. A field-effect transistor comprising:
- a first, a second and a third metal electrodes; a semiconductor region;
- an insulation region sandwiched between said third metal electrode and said semiconductor region;
- a current flow path being generated through said semiconductor region between said first and second metal electrodes when a predetermined voltage is applied to said third metal electrode, said field-effect transistor being fabricated using steps of:
  - (a) a forming step of forming a metal film on an insulation substrate;
  - (b) a first patterning step of patterning said metal film into a first metal electrode and a second metal electrode;
  - (c) a discharging step of discharging an impurity gas over said first and second metal electrodes;
  - (d) a depositing step of depositing an amorphous silicon film, an insulation film and a gate electrode film, in said order, on said first and second electrodes and on said insulation substrate said amorphous silicon film is in electrical and physical contact with said first and second electrodes; and
  - (e) a second patterning step of patterning a multi-layer film comprising said amorphous silicon film, said insulation film and said gate electrode film into a gate electrode pattern.

14. An image display apparatus, comprising:
- a plurality of field-effect transistors, each transistor having a first, second, third, fourth and fifth region;
- a current flow path being generated through said fifth region between said first and second regions when a predetermined voltage is applied to said third region;
- said first region being made of a transparent conductive material and is physically and electrically connected to said fifth region;
- said second region being made of opaque conductive material and is physically and electrically connected to said fifth region;
- said third region being made of conductive material and is deposited on said fourth region;
- said fourth region being made of insulation material and is deposited on said fifth region; and
- said fifth region being made of semiconductor material;
- said third region is a gate electrode and said first region or said second region is a source or drain electrode, respectively;
- a gate electrode of each of said transistors being connected to one of a plurality of gate lines and source or drain electrodes of each of said transistor being connected to one of a plurality of data lines;
- a transparent substrate provided with said plurality of field-effect transistors, said gate lines and said data lines being placed; and
- liquid crystal provided on each of said transistors.

15. The image display apparatus according to claim 14, further comprising:
- means for driving said plurality of field-effect transistors through said gate lines; and
- means for driving said plurality of field-effect transistors through said data lines.

16. The image display apparatus according to claim 14, further comprising:
- a plurality of color filters, each of which has a corresponding part in said liquid crystal.

17. The image display apparatus according to claim 14, further comprising:
- a light source for emitting light through said insulation substrate and transparent conductive electrode.

18. The field-effect transistor according to claim 9, wherein said second region is smaller than said sixth region.

19. A field effective typed insulation gate thin film transistor, comprising:
- a source electrode and a drain electrode, which are isolated from each other;
- wherein, one of said electrodes is made of transparent electrode material, and the other, of opaque metal material.

20. A field effective insulated gate thin film transistor, comprising:
- a source electrode and a drain electrode, which are isolated from each other;
- wherein, one of said electrodes is made of transparent electrode material, and the other, comprising a multi-layer structure of metal material and transparent material, said metal material disposed under said transparent material.

* * * * *